United States Patent [19]

Houston

[11] 4,280,093
[45] Jul. 21, 1981

[54] ZERO-CURRENT DETECTOR FOR HIGH VOLTAGE DC TRANSMISSION LINE

[75] Inventor: John M. Houston, Schenectady, N.Y.

[73] Assignee: General Electric Company, Schenectady, N.Y.

[21] Appl. No.: 69,835

[22] Filed: Aug. 27, 1979

[51] Int. Cl.³ ............................................. G01R 15/02
[52] U.S. Cl. ................................. 324/117 R; 324/127
[58] Field of Search ................... 324/117 R, 127, 133; 323/89 R, 89 B; 340/664

[56] References Cited

FOREIGN PATENT DOCUMENTS 15940 11/1956 Fed. Rep. of Germany ...... 324/117 R

Primary Examiner—Ernest F. Karlsen
Attorney, Agent, or Firm—Nathan D. Herkamp; James C. Davis, Jr.; Paul R. Webb, II

[57] ABSTRACT

A saturable magnetic reactor is disposed about one of the current-carrying conductors in a DC power transmission line. A zero-current status for the transmission line is sensed by means of impedance changes in the reactor. A step-down transformer cascade electromagnetically couples the saturable reactor to impedance detection means, which means typically comprise an oscillator driven bridge circuit.

8 Claims, 4 Drawing Figures

ZERO-CURRENT DETECTOR FOR HIGH VOLTAGE DC TRANSMISSION LINE

BACKGROUND OF THE INVENTION

The present invention relates to zero-current detectors for high voltage DC power transmission lines and in particular to such a detector employing a saturable magnetic reactor.

The sensing of current (including zero current) in an AC line is typically done with a "current transformer" which consists of a large iron core which circles the AC line and is dielectrically insulated from it. If a multi-turn winding on the iron core is loaded with a sufficiently small load resistance, then the voltage generated across the load resistance is a faithful replica of the current in the AC line.

For high voltage direct-current transmission, the magnetic flux surrounding the conductor is relatively constant so a conventional iron-core current transformer would not work, i.e., the core would merely saturate. If one omitted the iron core, i.e., merely used the voltage output of a coil adjacent to the line, this also is incapable of indicating the magnitude of the DC current. The reason for this is that the coil output voltage merely indicates the time-rate-of-change of the line current, i.e., the coil output would be identical for a current change going from 2,000 amp to 1,500 amp (in a given time) as for a current change going from 500 amp to zero amp in the same time. Thus, coil output would merely indicate a change in current, but not the magnitude of the current.

The desirability of providing zero-current sensors for high voltage DC power transmission lines is becoming greater because of the increased use of DC transmission lines for long distance power transmission. Any inefficiencies which may result in converting the alternating current to direct current and back again at the terminal ends of the transmission line are compensated for by the increased transmission efficiency of direct-current power. To provide increased system reliability, the DC power transmission lines are typically provided in side-by-side pairs, so that if there is a failure in one pair, service may be restored through the system through the other pair. The use of such pairs is particularly prevalent along those portions of the transmission line where repair is difficult or would be slow, for example, along an underwater path. If a failure occurs on one of the transmission line pairs, it is highly desirable that the DC power be rapidly switched to the alternate line in order to minimize the disruption of service. This is done by gradually lowering the DC current on the line until the current is low enough so that the switches employed can interrupt it. The switches now employed cannot interrupt a DC current of more than approximately 10 amperes. Hence, it is necessary to locate a zero-current sensor at each switch to detect when the line current is low enough so that the switch can be opened without damage.

Typical high voltage DC power transmission lines operate at power levels of approximately 400,000 volts and 2,000 amperes. For such lines, present zero-current sensors must not only be placed near the terminal ends of the line but also along the lines at switch positions which may be located tens or hundred of miles from the terminal equipment. Each of these zero-current sensors disposed along the transmission line now comprises a free standing device called a "transductor", typically costing approximately sixty thousand dollars if rated at 400 kV. The primary reason for this high cost is the insulation required. Accordingly, the cost of such sensors significantly adds to the ultimate price of the DC power system.

U.S. Pat. No. 4,087,701 issued May 1978 to John M. Anderson and assigned to the same assignee as the present invention describes a transformer cascade for delivering relatively low levels of electric power to electronic systems and instrumentation operating on high voltage transmission lines. These transmission lines may be either direct current lines or alternating current transmission lines. In the Anderson invention, power is transmitted from a source at ground potential to instrumentation circuits operating at line potential through a cascade of transformers, each having relatively low voltage insulation and a turns ratio of approximately 1:1. The contents of this Anderson patent are hereby incorporated herein by reference.

SUMMARY OF THE INVENTION

In accordance with a preferred embodiment of the present invention, a saturable magnetic reactor is disposed about one of the conductors of a high voltage DC power transmission line. This reactor is coupled to impedance detecting means through a step-down transformer cascade. The impedance detecting means typically comprises a bridge circuit driven by an oscillator operating at super audio frequencies. A filter is also preferably provided which is tuned to the oscillator frequency. In accordance with another embodiment of the present invention, the saturable reactor may also include a second winding terminated in a resistive load. At zero DC current, the magnetic core unsaturates, thus causing a large change in the input impedance of the cascade transformer. This impedance change may be detected by a simple bridge circuit at ground potential.

Accordingly, it is an object of the present invention to provide an inexpensive zero-current detector for a high voltage direct current power transmission line.

DETAILED DESCRIPTION OF THE INVENTION

Figure 1:
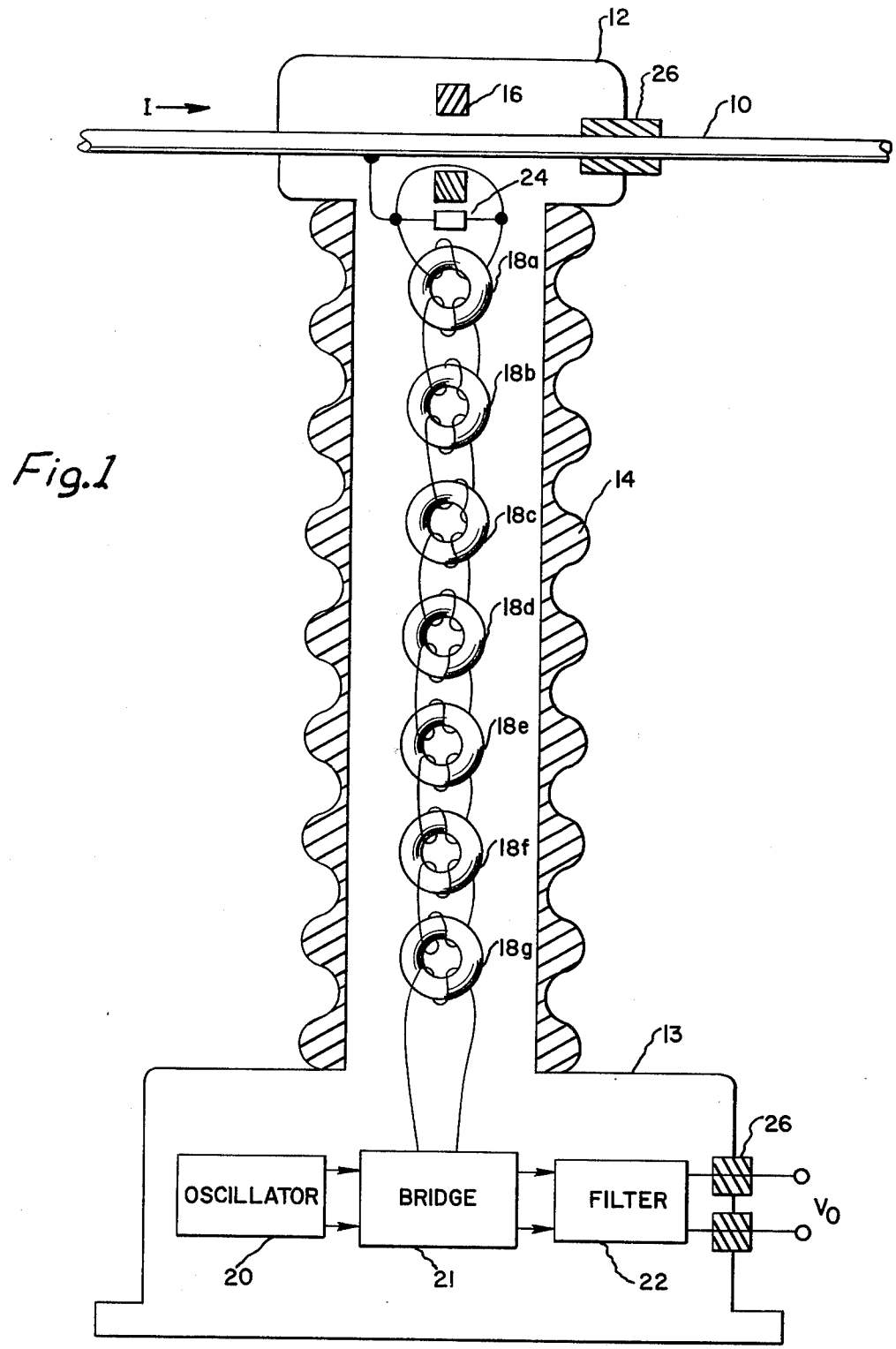
FIG. 1 is a partial cross-sectional side elevation and schematic diagram illustrating the zero-current detector of the present invention.

In FIG. 1, a single conductor 10 of a multi-conductor high voltage DC transmission line carrying current I passes through saturable reactor core 16. This core preferably is toroidal and comprises material such as iron or ferrite. For convenience, a metal corona shield and weather housing 12 is provided atop porcelain insulator 14 which is approximately 15 feet in length. The porcelain insulating house 14 is generally cylindrical in shape with exterior fluting to increase the arc-over path length. Along the central axis of the insulator cylinder there are disposed a series of cascaded transformers which typically comprise toroidal ferrite cores, designated, for example, in FIG. 1 by 18a–18g. Each of these cores possesses two windings for coupling to its immediately adjacent core as shown. However, the uppermost core in the cascade is coupled to saturable reactor 16 and the lowermost core in the cascade 18g is connected to a circuit which essentially acts as an impedance sensor.

A preferable embodiment for this impedance sensor includes an oscillator which drives a conventional bridge circuit. One arm of the bridge circuit comprises the transformer cascade terminated in the saturable magnetic core 16. The output voltage measured across a selected pair of bridge terminals is then preferably connected to a bandpass filter which is tuned to accept signals having the frequency of the oscillator and a reasonable bandwidth surrounding this central oscillator frequency. Accordingly, there is shown in FIG. 1 oscillator 20 connected to bridge circuit 21 having as one arm thereof the transformer cascade, said filter 22 being connected to an appropriate pair of bridge circuit nodes. The output of the filter, $V_o$ is fed out of the external housing through feed-through bushings 26. The lower portion of the housing 13 is at ground potential and, accordingly, none of the electronics of the present invention are at the line potential. Also shown in FIG. 1 is feed-through bushing 26 on the corona housing 12. This bushing insures that the conduction of the current occurs through the line 10 passing through the core 16 rather than through a path which circumvents core 16. Additionally, if desired, a metal oxide varistor device 24 for overvoltage protection may be provided in parallel across the windings coupling toroid 18a to saturable reactor 16. The varistor device is selected to be usually nonconducting and functions to absorb voltage surges induced by sudden changes in the high voltage DC current. However, this is not a serious problem since surge voltages are usually limited by the rapid saturation of the sensing core. Furthermore, although not shown in FIG. 1, capacitive and/or resistive potential grading circuits may be employed to maintain a constant voltage gradient between the sequential cores in the transformer cascade. Such grading circuits are shown and described in the aforementioned Anderson patent.

When the high voltage DC line is carrying its normal current (approximately 2,000 amperes), the sensing core 16 is saturated. When the line current approaches zero, the core unsaturates and the impedance looking into the saturable reactor 16 changes from a very small inductance to a much larger inductance. A similar impedance change also appears at the bottom most (input) winding on core 18g of the transformer cascade. That is, the impedance looking into the transformer cascade changes from being close to a short circuit to being close to an open circuit. This impedance change is maximum at zero line current and falls off rapidly as the line current departs from zero and would be considerably reduced, for example, at a DC line current of 5 amperes.

The impedance change near the zero current condition is detected by a simple bridge circuit operating at super audio frequencies. For example, at a frequency of approximately 30 KHz, a transformer cascade comprising toroidal ferrite cores exhibits an overall transmission efficiency of 80 percent even though the core windings are not coaxial (see FIG. 1). The cascade transformer forms one arm of the bridge circuit. The bridge is adjusted so that it is balanced (zero output) when the sensing toroid 16 is saturated. Thus, at zero line current the bridge exhibits a large unbalance. The bridge output voltage is thus a measure of the DC line current near the zero-current level.

Because ripple and other transient signals on the high voltage DC line may also be coupled into the bridge circuit near the cascade transformer, particularly near zero-current conditions, a filter is preferably provided at the bridge output so as to pass only signals in a relatively narrow bandwidth surrounding the oscillator frequency. This prevents the bridge output from being affected by these other signals.

Figure 2:
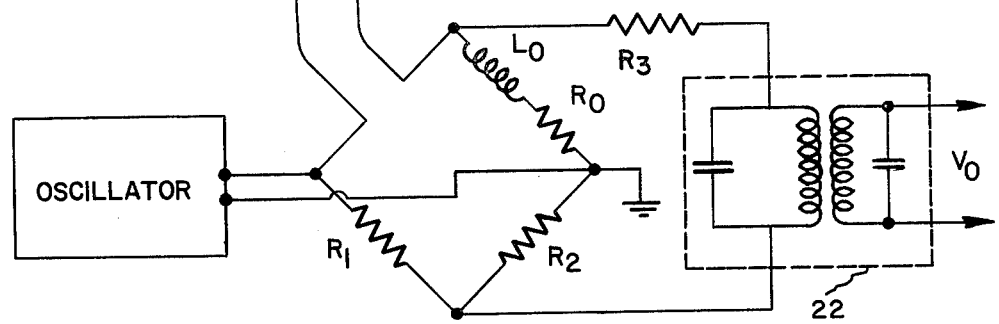
FIG. 2 is a schematic diagram detailing the bridge and filter circuits of FIG. 1.
Figure 4:
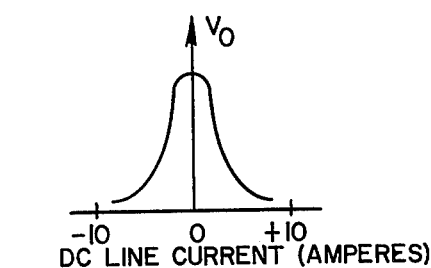
FIG. 4 is a graph of the output voltage as a function of the line current.

FIG. 2 is a schematic diagram illustrating a bridge circuit and filter which may be employed in the present invention. The bridge is a conventional bridge circuit with four arms, or sides. Two of these armas preferably comprise pure resistances $R_1$ and $R_2$ which are joined at a common node. The other two sides of the bridge comprise circuit elements as shown. In particular, one of these arms comprises the transformer cascade which is coupled to the saturable reactor. The last remaining arm comprises a series combination of an inductance $L_o$ and a resistance $R_o$. The values $L_o$ and $R_o$ are chosen to match the impedance seen looking into the cascade transformer when the reactor 16 is saturated. These four bridge arms are coupled to an oscillator 20 and preferably to a filter 22. The connections to these devices are best described if the four arms of the bridge are considered to be, for purposes of illustration, the four sides of a square. The output of the oscillator is connected to two diagonally opposite nodes and the input to the filter is connected to the other two other diagonally opposite nodes. The filter 22' shown in dotted lines in FIG. 2 may be any convenient conventionally employable bandpass filter. A simple filter is shown in FIG. 2 comprising a transformer, the primary and secondary of which are connected in parallel with separate capacitors such that the inductive-capacitive combination acts as a bandpass filter tuned to the frequency of the oscillator 20. Resistor $R_3$ is effective to insure selective frequency filtering regardless of the bridge impedance and is chosen to be approximately equal to the filter impedance at resonance. The rms output of the filter $V_o$ may be measured as shown and is plotted in FIG. 4 as a function of the DC line current. As seen in FIG. 4, the voltage output is maximally sensitive at zero-current DC line conditions.

Figure 3:
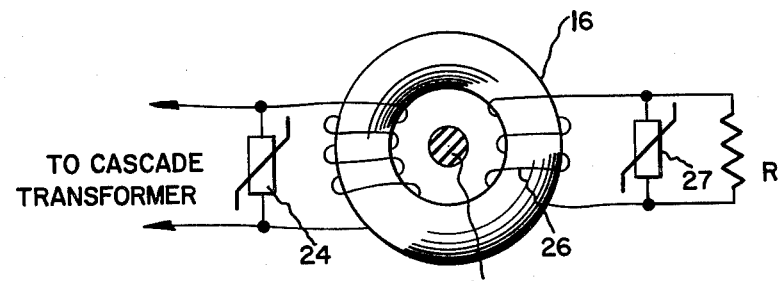
FIG. 3 is a schematic diagram illustrating an alternate embodiment for the saturable magnetic reactor circuit.

FIG. 3 illustrates an alternate embodiment of the saturable reactor 16 disposed about transmission line 10. In particular, a second winding 26 is provided about the reactor core and said winding is connected in parallel with a resistance R and a varistor 27, as shown. The varistors function as protective devices to absorb voltages induced because of transients or ripple currents on line 10. Using this alternate sensing core, the impedance seen looking into the primary (from varistor 24) changes from a small inductance when the core is saturated to essentially pure resistance under zero-current conditions in the line.

There are several significant advantages that this invention provides over conventional transducer methods of measuring zero DC line conditions. In particular, because it is much easier and less expensive to grade the high voltage down the length of the insulator, there is no need for expensive high voltage bushings. Such bushings are required in the conventional transductor because the sensing core in such tranductors is not kept at line potential and accordingly, the voltage grading must be accomplished in a 10 or 12 inch radius by employing such dielectric materials as $SF_6$ or a high dielectric strength oil. In the present invention, the sensing core is at line potential as shown in FIG. 1. Hence, the sensing core 16 may be much smaller in size and does not require the high voltage insulation between it and the line, which is required in conventional transductors. Another advantage of the present invention is that there are no active components at line potential and only a minimum number of passive components. Hence, system reliability is enhanced and the need for shut down of a DC transmission line to effect repairs is minimized.

From the above, it may be appreciated that the present invention provides an inexpensive and highly reliable zero-current detector for a high voltage DC transmission line.

While this invention has been described with reference to particular embodiments and examples, other modifications and variations will occur to those skilled in the art in view of the above teachings. Accordingly, it should be understood that within the scope of the appended claims, the invention may be practiced otherwise than is specifically described.

The invention claimed is:

1. A zero-current detector for a high voltage, multi-conductor DC power transmission line comprising:
 a saturable magnetic reactor disposed about one of said conductors;
 a cascade step-down transformer electromagnetically coupled to said reactor; and
 means to detect impedance changes in said magnetic reactor, said detection means being connected to said reactor through said transformer cascade.

2. The zero-current detector of claim 1 in which said impedance detection means comprises a four-arm resonant bridge circuit in which one arm includes the transformer cascade which is terminated at its other end by said saturable reactor.

3. The zero-current detector of claim 2 in which said bridge circuit is driven by an oscillator coupled to a pair of opposed corners of said four-arm bridge circuit.

4. The zero-current detector of claim 3 further including a bandpass filter connected to the remaining pair of opposed bridge circuit corners, said bandpass filter being matched to the frequency of said oscillator.

5. The zero-current detector of claim 3 in which said oscillator operates at a frequency of approximately 30 KHz.

6. The zero-current detector of claim 1 further including a porcelain housing surrounding said transformer cascade.

7. The zero-current detector of claim 1 in which said saturable magnetic reactor includes a separate winding terminated in a resistance.

8. The zero-current detector of claim 1 in which a varistor is connected in parallel with said saturable magnetic reactor.

* * * * *